United States Patent [19]
Nesheiwat et al.

[11] Patent Number: 5,892,777
[45] Date of Patent: Apr. 6, 1999

[54] APPARATUS AND METHOD FOR OBSERVING THE MODE OF A MEMORY DEVICE

[75] Inventors: Michael Nesheiwat, Hillsboro, Oreg.; Roger Grass, Pflugerville; Arthur O'Donnell, Austin, both of Tex.

[73] Assignee: Motorola, Inc., Schaumburg, Ill.

[21] Appl. No.: 851,287

[22] Filed: May 5, 1997

[51] Int. Cl.[6] ................................................. G01R 31/28
[52] U.S. Cl. ........................................... 371/21.1; 365/201
[58] Field of Search ................................. 371/21.1, 25.1, 371/37.6, 40.4, 67.1, 21.2, 27.5, 27.6; 395/430, 481, 183.13, 184.01, 183.06, 183.12; 365/201, 189.02, 189.01, 230.02, 230.08, 189.03, 189.05

[56] References Cited

U.S. PATENT DOCUMENTS

| | | | |
|---|---|---|---|
| 5,317,712 | 5/1994 | Peek et al. | 395/425 |
| 5,402,389 | 3/1995 | Flannagan et al. | 365/233 |
| 5,568,437 | 10/1996 | Jamal | 365/201 |
| 5,587,961 | 12/1996 | Wright et al. | 365/233 |
| 5,627,838 | 5/1997 | Lin et al. | 371/21.1 |
| 5,715,476 | 2/1998 | Kundu et al. | 395/855 |
| 5,729,553 | 3/1998 | Motohara | 371/22.5 |

*Primary Examiner*—Robert W. Beausoliel, Jr.
*Assistant Examiner*—Nadeem Iqbal
*Attorney, Agent, or Firm*—Lee E. Chastain

[57] ABSTRACT

A method and apparatus observes a mode register (102) in a synchronous memory device. A multiplexer (306) selects the value of the mode register (102) or the conventional data path of the memory array (302) through the output buffer. The invention outputs the stored value of the control register (102) on output pins, such as address pins when no signal is expected. The multiplexer (306) maybe responsive to a variety of control signals.

15 Claims, 3 Drawing Sheets

APPARATUS AND METHOD FOR OBSERVING THE MODE OF A MEMORY DEVICE

FIELD OF THE INVENTION

The present invention generally relates to memory devices, and more specifically to devices and methods used to test memory devices.

BACKGROUND OF THE INVENTION

Computer systems and communication systems require various memories to store and retrieve information associated with any given operating system, or database. Presently, a variety of memories are used over a wide range of applications. For example, nonvolatile memories are used in cellular telephone applications, while volatile memories are used as cache memory and main memory in personal computers.

Traditionally, memory has been the bottleneck of communication systems and computer systems due to its slower access speed with respect to the processing speed of the associated microprocessor or microcontroller. Synchronous memories have been developed to temporarily alleviate this memory bottleneck. Synchronous dynamic random access memory ("SDRAM", hereafter) has been introduced with processing speeds of 85 megahertz and more.

SDRAMs offer a different concept in memory architecture with respect to traditional dynamic random access memory ("DRAM", hereafter). Traditional DRAMs include fast page mode (FPM) and extended data out (EDO) modes. SDRAMs have many features to improve their performance. For instance, SDRAMs have the ability to interleave between multiple banks of memory. SDRAMs also contain logic to operate as a state machine based on an externally supply system clock. All address, command, data and input/output ("I/O") signals are synchronized on the positive edge of an externally supplied system clock. The complexity of the SDRAM with the state machine and the higher operating speeds increases the difficulty of testing it. For example, as an SDRAM changes states, it is difficult to predict what the output will be without knowing the particular state. Also, an invalid state can be entered and the ability to escape from the state may be difficult. Presently, SDRAMs do not offer a reset feature.

Embedded memories are also used to alleviate the memory bottleneck. Various DRAM and SRAM memories are now embedded on microprocessors and microcontrollers. Embedded memories reduce layout, increase the access speed, and decrease the overall manufacturing costs of the systems in which they are incorporated. However, embedded memories do not have external pins. Therefore, testing embedded memories is also difficult. In these case, the microprocessor or microcontroller controls the memory testing by sending and receiving address and data information to and from the embedded memory.

Various test philosophies have been developed to test embedded memories; including built in self test and boundary scan. However, these test methodologies increase silicon area and overall cost. Also, they test the part to determine if it functions properly instead of observing what state the part is in.

BRIEF DESCRIPTION OF THE DRAWINGS

The features and advantages of the present invention will be more clearly understood from the following detailed description taken in conjunction with the accompanying figures where like numerals refer to like and corresponding parts, and in which.

DETAILED DESCRIPTION OF THE DRAWINGS

SDRAMs offer many features including quicker access speeds, interleave banks, and a mode register which controls their operation. Testing SDRAMs involves a variety of issues and features. In particular, the state machine operation of an SDRAM depends upon the setting of the mode register. The various bits in the mode register define the operation of the SDRAM. Therefore, knowing the state of the mode register is advantageous to verifying the validity of the output. The present invention utilizes minimum silicon area to observe the value of the mode register. The invention provides for the observation of the value of the mode register on any of the output pins including the address, data, and other controls pins. This observability substantially eases the burden of testing a data processing system incorporating a memory device constructed in accordance with the present invention.

Figure 1:
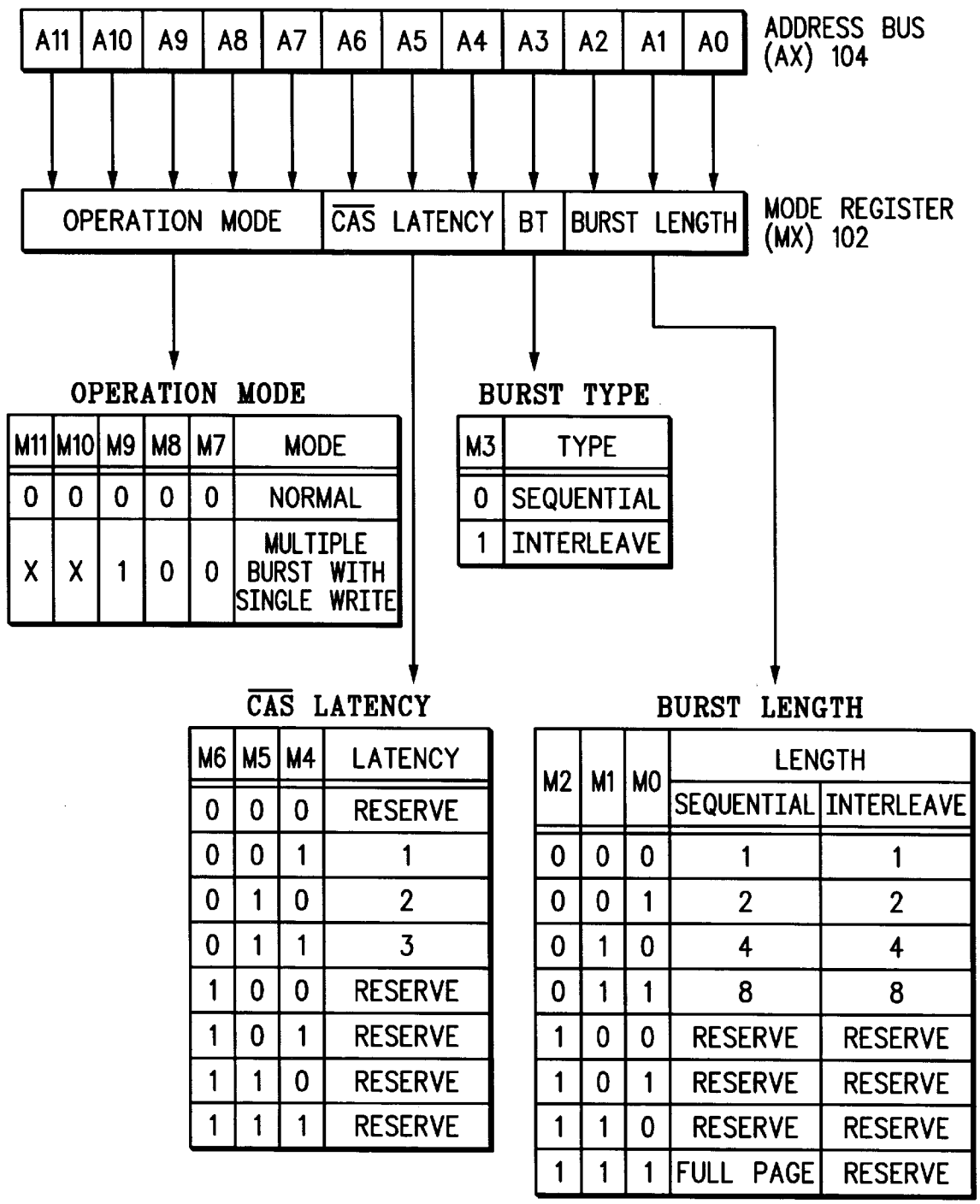
FIG. 1 depicts a conceptual representation of a mode register useful in the operation of memory devices.

FIG. 1 depicts a conceptual representation of a mode register 102 useful in the operation of and incorporated into a memory device, such as in an SDRAM. The diagram illustrates how various address pins on the address bus 104 are connected to the various fields of the mode register 102. Address pins A0 through A2 of the address bus 104 set bits 0 through 2 of the mode register 102. Address A3 of the address bus 104 sets bit 3 of the mode register 102. Address pins A4 through A6 of the address bus 104 sets bits 4 through 6 of the mode register 102. Address pins A7 through A11 of the address bus 104 sets bits 7 through 11 of the mode register 102.

During the operation of a memory device such as an SDRAM, a particular value is written into mode register 102 corresponding to the desired operational characteristics of the memory device. Typically, a microprocessor or a microcontroller writes this value to mode register 102 during system start-up. Such a control device writes a particular value to mode register 102 by simultaneously broadcasting the desired value on address bus 104 and asserting a particular set of control signals. In one embodiment, the control device simultaneously asserts a chip select signal, a clock enable signal, a row address strobe signal, a column address strobe signal, and a write enable signal.

Continuing with the mode register 102, bits 0 through 2 define the burst length of data transfers. Presently, SDRAMs support burst lengths of 1, 2, 4, and 8 bits of data in either a sequential or an interleaved format. The encodings for these four options in each mode are depicted in the box labeled BURST LENGTH. Additionally, the encoding comprising all is defines a full page data transfer for the sequential burst type.

Bit 3 of the mode register 102 defines the burst type. A burst type is the method of transitioning among a plurality of memory banks within the SDRAM memory device. A sequential burst type (A3=0) accesses the memory bits in a linear increasing order. For example, a sequential burst type access accesses memory bit 0, then memory bit 1, 2, 3,... and back to 0. An interleave burst type (A3=1) accesses a plurality of memory bits in a random method defined by the microprocessor. For example, an interleave burst type accesses memory bit 2, then memory bit 0, then memory bit 3,... Presently, microprocessor manufacturers specify the burst type.

Bits 4 through 6 of the mode register 102 define the column address strobe (CAS) latency. Presently, CAS latency values of 1, 2, and 3 are supported in the industry. The encodings for these three options are depicted in the box labeled CAS LATENCY. CAS latency defines the number of clock cycle delays between the receipt of a valid column address at the SDRAM and a valid data on the output pins by the SDRAM (the row address strobe, RAS, is a control signal indicating a valid row address). The user defines the CAS latency for optimal system performance based upon the speed of the external system clock provided to the SDRAM.

Bits 7 through 11 of the mode register 102 define the operation mode. Currently, the operation modes that are defined are a normal operation mode and a multiple burst with single write mode. The encodings for these two operations are depicted in the box labeled OPERATION MODE.

It should be understood that the aforementioned fields and field values are those that exist at a particular point in time. They should be expected to evolve over time. Furthermore, the current invention will be as applicable to future fields and field values as it is to those depicted in FIG. 1.

Figure 2:
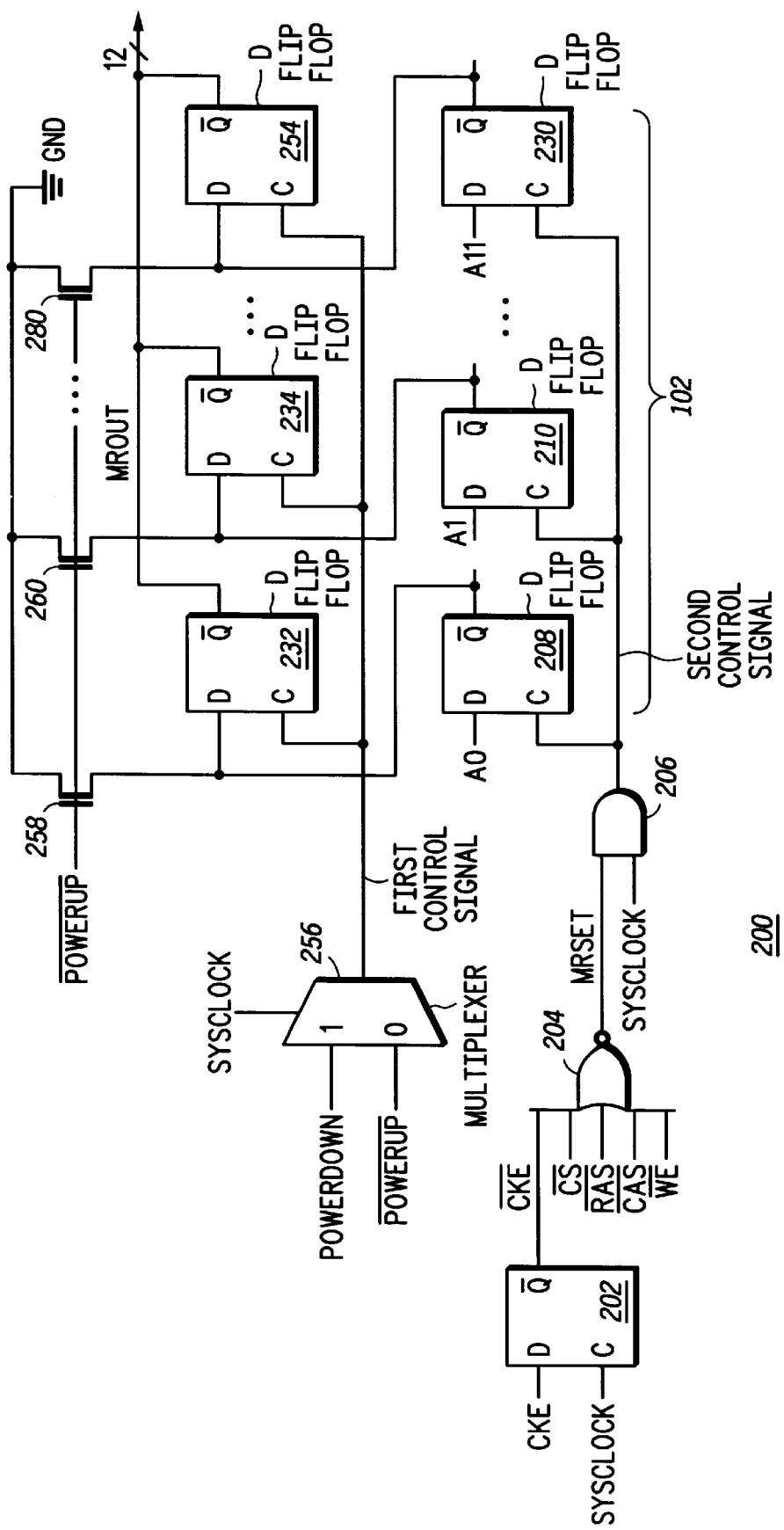
FIG. 2 depicts a first embodiment of a circuit diagram of a portion of a memory device constructed in accordance with the present invention.

FIG. 2 depicts a first embodiment of a circuit diagram of a portion of a memory device 200 constructed in accordance with the present invention. A data input, D, and a clock input, C, of a D flip flop 202 receive a clock enable signal, CKE, and a clock signal, SYSCLOCK, respectively. A complementary data output, $\overline{Q}$, of the D flip flop 202 generates a complement of the clock enable signal, $\overline{CKE}$ synchronous with the clock signal, SYSCLOCK. The five inputs of a five input NOR gate 204 receives (1) the complement of the clock enable signal, $\overline{CKE}$, (2) the complement of a chip select signal, $\overline{CS}$, (3) the complement of the RAS signal, $\overline{RAS}$, (4) the complement of the CAS signal, $\overline{CAS}$, and (5) the complement of write enable signal, $\overline{WE}$. An output of the NOR gate 204 generates a mode register set signal, MRSET. A first and a second input of an AND gate 206 receive the clock signal, SYSCLOCK, and the MRSET signal respectively. An output of the AND gate 206 generates a second control signal.

Mode register 102 consists of a plurality of D flip flops 208, 210, ..., and 230. The plurality of D flip flops 208, 210, ... and 230 receive the SECOND CONTROL SIGNAL at their clock inputs, C. A complementary data output of each of the plurality of D flip flops 208, 210, ... and 230, $\overline{Q}$, generates a complement signal of the mode register 102. The signals are used by other portions of memory device 200 as described above in connection with FIG. 1.

Continuing with FIG. 2, each of the complementary data outputs, $\overline{Q}$, of the plurality of D flip flops 208, 210, ... and 230 is connected to a differing one of a plurality of D flip flops 232, 234, ... and 254. The plurality of D flip flops 232, 234, ... and 254 comprise a register of equal bit width as mode register 102. A data output, D, of each of the plurality of D flip flops 232, 234, ... and 254 generate a differing one of the twelve bits forming MROUT. Under circumstances described below, MROUT is potentially equivalent to the contents of mode register 102. Each of the plurality of D flip flops 232, 234, ... and 254 receives a FIRST CONTROL SIGNAL at a clock input C.

A multiplexer 256 receives a POWERDOWN signal at one input and a complement of the POWERUP signal at a second input. POWERDOWN signal and the complement of the POWERUP signal are connected to the one input and to the zero input of multiplexer 256, respectively. Multiplexer 256 receives the SYSCLOCK signal at a control input. The system clock signal, SYSCLOCK, controls the selection of POWERDOWN or $\overline{POWERUP}$ as the output of the multiplexer 256. The output of the multiplexer 256 generates the FIRST CONTROL SIGNAL.

A control electrode of each of a plurality of n type transistor 258, 260, ... and 280 receive the logical complement of the POWERUP signal. A ground supply, GND, is coupled to each first current electrode of the plurality of n type transistors 258, 260, ... and 280. Each second current electrode of the plurality of n type transistors 258, 260, ... and 280 are coupled to a differing one of the data inputs, D, of the plurality of D flip flops 232, 234, ... and 254.

In the operation of FIG. 2, the NOR gate 204 and the AND gate 206 assert the SECOND CONTROL SIGNAL, causing the first value of the mode register to be stored in the plurality of D flip flops 208, 210, ... and 230. As described above, current databook specifications require all the inputs to NOR gate 204 to be a logic zero to set the mode register 102.

The plurality of D flip flops 232, 234, ... and 254 latch the first value of the mode register 102 when memory device 200 enters into a POWERDOWN mode. The POWERDOWN mode is initiated by the SDRAM controller or by the user. In this embodiment, the user specifies a POWERDOWN mode by asserting the control signal POWERDOWN. During the POWERDOWN mode, the memory device 200 is disabled. During a POWERUP mode, the memory device 200 is re-enabled. In this case the data inputs of the plurality of D flip flops 232, 234, ... and 254 are coupled to a ground supply, GND. Therefore, the outputs of the second set of D flip flops generate logic ones.

Based on the operating modes of memory device 200, the present invention displays the last valid value of the mode register 102 or default value of all ones. In order to validate the proper operation of an SDRAM device, the present invention latches a default value on POWERUP mode. In the case of a POWERDOWN mode, the SDRAM device does not expect to receive any inputs on the pins, therefore, the present invention can display the last valid value of the mode register 102. The display of the last valid value of the mode register 102 is described below in connection with FIG. 3.

Figure 3:
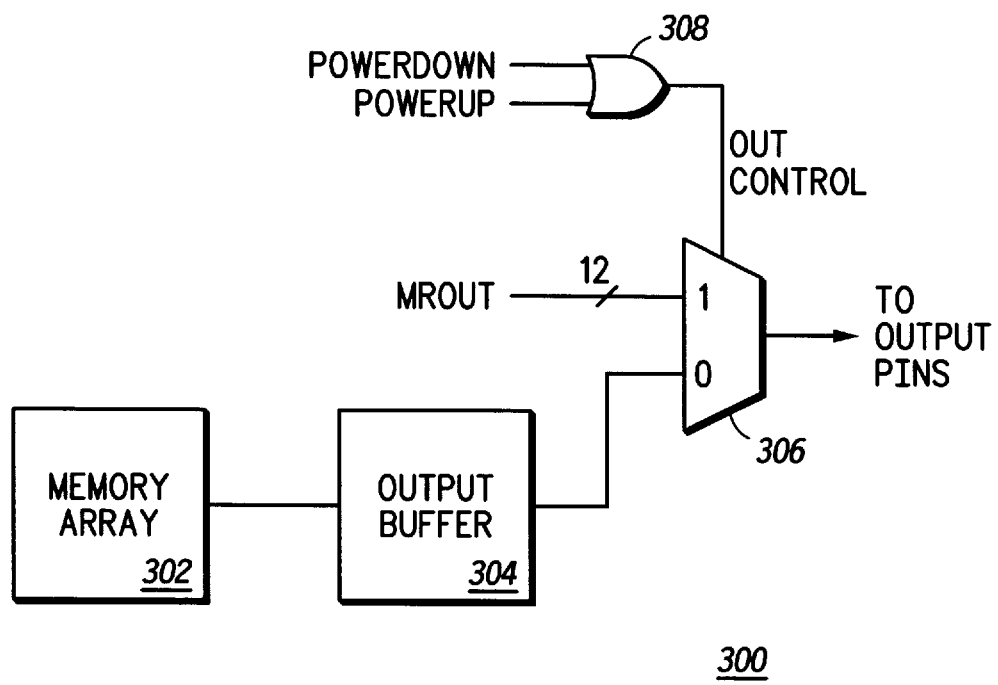
FIG. 3 depicts a block diagram of a memory device constructed in accordance with the present invention.

FIG. 3 depicts a switching block diagram of a memory device 300 constructed in accordance with the present invention. A memory array 302 contains a plurality of memory cells which is coupled to an output buffer 304. An output of the output buffer 304 is provided to a first input of a multiplexer 306 at the 0 input. The 12-bit MROUT signal is coupled to a second input of the multiplexer 306 at the 1 input. An OR gate 308 receives the POWERDOWN and the POWERUP signal at a first input and at a second input, respectively. An output of the OR gate 308 generates an OUT CONTROL signal and is provided to a control input of the multiplexer 306. An output of the multiplexer 306 is provided to the output pins of the memory device.

In the operation of memory device 300, the memory array 302 may consist of any memory device such DRAM, SRAM, SDRAM. After the memory array receives and decodes the row and column addresses, the memory array provides the information stored in the decoded memory cells to the output buffer 304. The output buffer transmits the selected information to the multiplexer 306. The OUT CONTROL signal determines which input to the multiplexer is transferred to the output pins. If either the POWERDOWN or POWERUP signal is a logic high, the OUT CONTROL signal is a logic high. Therefore, the multiplexer 306 outputs the MROUT signal on the address pins if the OUT CONTROL signal is a logic high. Otherwise, the conventional method of displaying the address from the memory array is transmitted to the output pins through the 0 input of multiplexer 306. The output multiplexer 306 may transmit either of its inputs to the address, data or control pins on the memory package.

The advantages of the memory device 300 include the ability to select the conventional data path or the value of the mode registers defined in A0 through A11 to the output pins. The present invention does not effect the conventional operation of the memory device.

Figure 4:
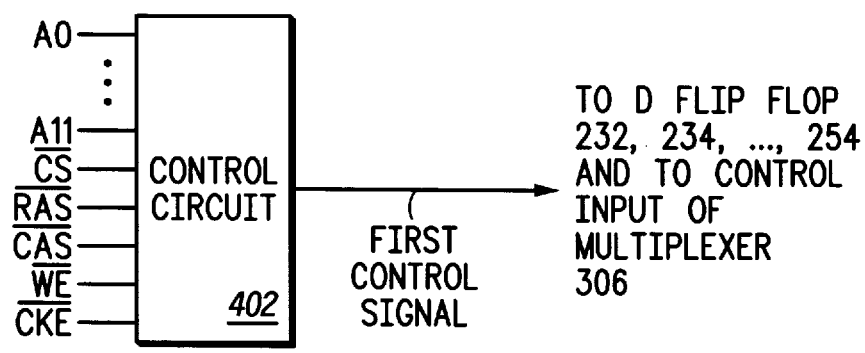
FIG. 4 depicts a second embodiment of a circuit diagram of the portion of the memory device depicted in FIG. 2.

FIG. 4 depicts a second embodiment 400 of a circuit diagram of the portion of the memory device 200 depicted in FIG. 2. Here, a control circuit 402 receives the plurality of inputs including address bits A0 through A11, the complement of the chip select signal, $\overline{CS}$, the complement of row address strobe, $\overline{RAS}$, the complement of the column address strobe, $\overline{CAS}$, the complement of the write enable signal, $\overline{WE}$, and the complement of the clock enable signal, CKE. An output of the control circuit 402 generates the FIRST CONTROL SIGNAL. The FIRST CONTROL SIGNAL is provided to the clock inputs, C, of the plurality of D flip flops 232, 234, . . . and 254 (depicted in FIG. 2) and to the control input of multiplexer 306 (depicted in FIG. 3).

In the operation of FIG. 4, control circuit 402 causes memory device 400 to latch and output the contents of the mode register 102 based on any predetermined condition: POWERDOWN, address input value, data input value, timing signal relationship, etc.

Although the present invention has been described with reference to a specific embodiment, further modifications and improvements will occur to those skilled in the art. It is to be understood therefore, that the invention encompasses all such modifications that do not depart from the spirit and the scope of the invention as defined in the appended claims.

We claim:

1. A method for observing a control register in a memory device, the control register defining an operation of the memory device, the control register not observable from the memory device, the method comprising the steps of:

storing a received value in the control register responsive to a first signal;

outputting the received value responsive to a second control signal when no output is expected from the memory device; and disabling the operation of the memory device responsive to the second control signal subsequent to the step of outputting.

2. The method of claim 1 wherein the step of outputting the received value further comprises the step of:

switching between an output of a memory array and the received value responsive to a first control signal.

3. The method of claim 1 wherein the step of outputting comprises the step of outputting the contents of a mode register of a synchronous DRAM.

4. The method of claim 1 wherein the step of storing the received value further comprises the step of:

transferring the received value to a second register responsive to the first signal.

5. The method of claim 4 further comprising the step of:

initializing the second register to a default value of all ones.

6. An apparatus for observing a mode of a memory device comprising:

a multiplexer selectively outputting either a first input or a second input responsive to a first control signal;

a first register storing a first value defining an operation of the memory device, the first register generating the first input;

a memory array storing a plurality of data bits responsive to received addresses, the memory array generating the second input; and control logic generating the first control signal responsive to a received signal indicative of a power down command, the control logic generating the first control signal when no output is expected from the memory device.

7. The apparatus of claim 6 further comprising:

a second register for storing the first value responsive to a second control signal.

8. The apparatus of claim 7 wherein the control logic initializes the second register to a default value.

9. The apparatus of claim 6 wherein the memory device is a synchronous dynamic random access memory (SDRAM).

10. An apparatus for observing a mode of a memory device comprising:

a gating means for selectively outputting either a first input or a second input responsive to a first control signal;

a register storing a value defining an operation of the memory device, the register generating the first input;

storage means for storing a plurality of data bits responsive to received addresses, the storage means generating the second input; and control logic generating the first control signal responsive to a predetermined value of the register.

11. The apparatus of claim 10 further comprising:

a second register for storing the first input responsive to a second control signal.

12. The apparatus of claim 11 wherein the control logic initializes the second register to a default value.

13. The apparatus of claim 11 wherein the gating means transmits the first input responsive to the second control signal.

14. The apparatus of claim 10 wherein the gating means transmits the first input responsive to a predetermined test mode.

15. The apparatus of claim 10 wherein the memory device is a synchronous dynamic random access memory (SDRAM).

* * * * *